United States Patent
Stojcevska et al.

(10) Patent No.: US 9,589,631 B2
(45) Date of Patent: Mar. 7, 2017

(54) ULTRAFAST QUENCH BASED NONVOLATILE BISTABLE DEVICE

(71) Applicants: Institut Jozef Stefan, Ljubljana (SI); Center Odlicnosti Nanoznanosti In Nanotehnologije—Co Nanocenter, Ljubljana (SI)

(72) Inventors: Ljupka Stojcevska, Ljubljana (SI); Tomaz Mertelj, Ljubljana (SI); Igor Vaskivskyi, Kijev (UA); Dragan Mihailovic, Ljubljana (SI)

(73) Assignee: Institut "Jozef Stefan" (SI)

( * ) Notice: Subject to any disclaimer, the term of this patent is extended or adjusted under 35 U.S.C. 154(b) by 0 days.

(21) Appl. No.: 14/648,902

(22) PCT Filed: Sep. 30, 2013

(86) PCT No.: PCT/SI2013/000056
§ 371 (c)(1),
(2) Date: Jun. 1, 2015

(87) PCT Pub. No.: WO2014/084799
PCT Pub. Date: Jun. 5, 2014

(65) Prior Publication Data
US 2015/0340089 A1 Nov. 26, 2015

(30) Foreign Application Priority Data

Nov. 30, 2012 (SI) .................................. 201200364

(51) Int. Cl.
*G11C 11/00* (2006.01)
*G11C 13/00* (2006.01)
(Continued)

(52) U.S. Cl.
CPC ...... *G11C 13/0004* (2013.01); *G11B 7/00454* (2013.01); *G11B 7/2433* (2013.01);
(Continued)

(58) Field of Classification Search
CPC ............ G11C 13/0004; G11C 13/0007; G11C 13/0097; G11C 13/004; G11C 13/047;
(Continued)

(56) References Cited

U.S. PATENT DOCUMENTS 7,491,573 B1* 2/2009 Schrott .................. H01L 45/06
257/E21.662
2003/0161245 A1* 8/2003 Henrichs .................. G11B 7/12
369/95
(Continued)

OTHER PUBLICATIONS

Ultrafast Melting of a Charge-Density Wave in the Mott Insulator 1T-TaS2, Oct. 29, 2010.*

*Primary Examiner* — Tha-O H Bui
(74) *Attorney, Agent, or Firm* — The Watson I.P. Group, PLC; Jovan N. Jovanovic; Vladan M. Vasiljevic

(57) ABSTRACT

The invention refers to an ultrafast quench based nonvolatile bistable device which consists of an active material on a passive or active substrate which changes its physical properties, after exposure to a sufficiently temporally short external perturbation causing an ultrafast quench. The perturbation can be from an external ultrashort laser pulse or ultrafast electrical pulse from an electrooptic device or any other generator of ultrashort pulses. This change of the materials properties can be detected as a change of optical properties or electrical resistance. The dielectric properties can be reverted back to their original state by the application of a heat pulse applied by an electrical heater within the device or an external laser.

14 Claims, 7 Drawing Sheets

Figure 1:
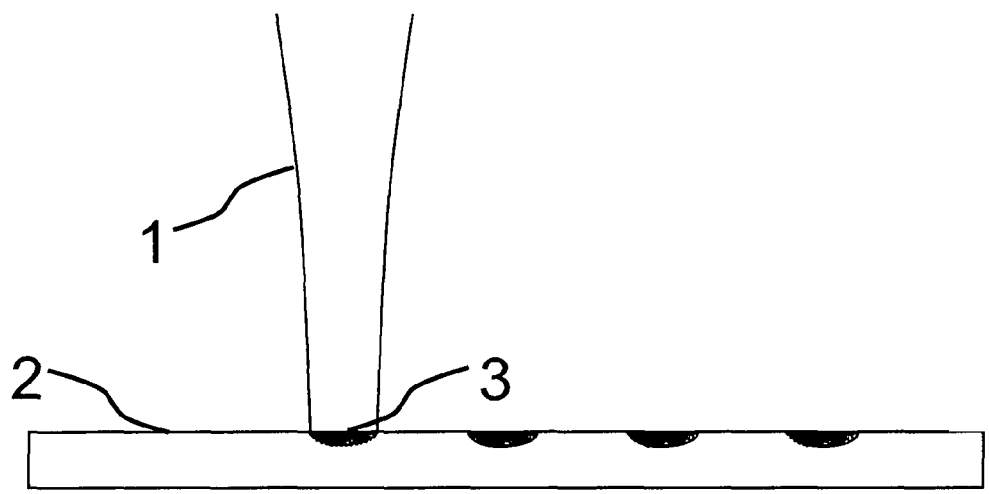
Figure 1:
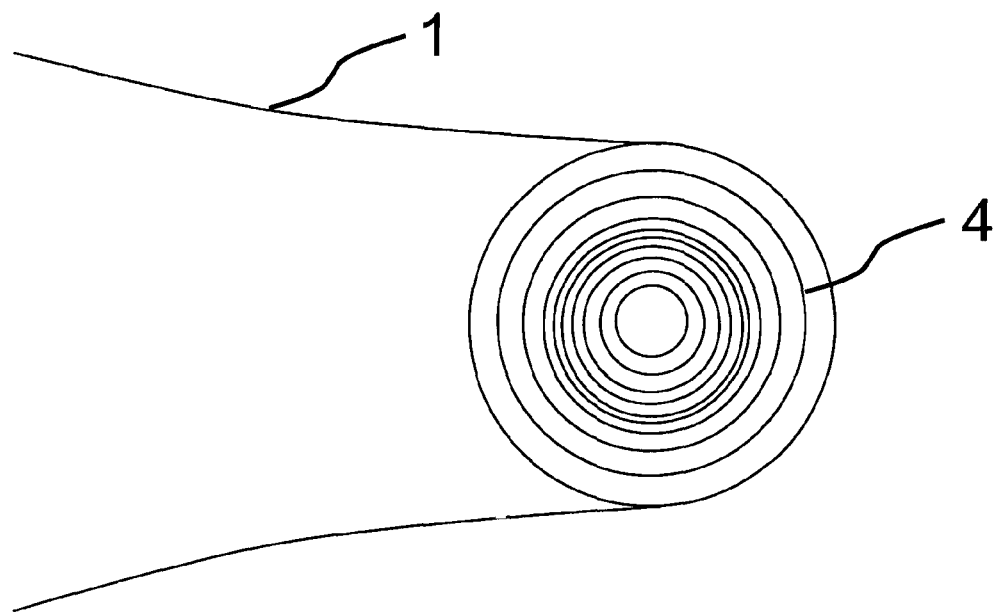
Figure 1:
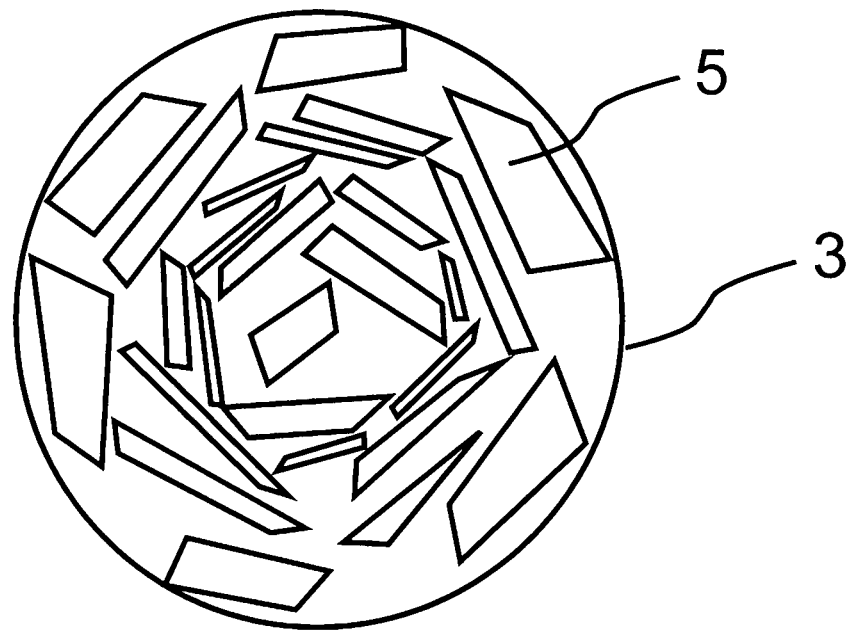
Figure 1:
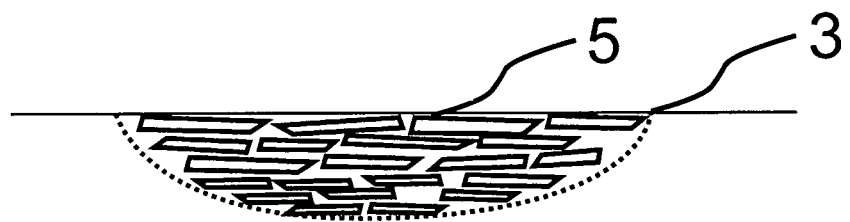

(51) Int. Cl.
*G11C 13/04*   (2006.01)
*G11B 7/0045*  (2006.01)
*G11B 9/04*    (2006.01)
*G11B 11/08*   (2006.01)
*G11B 7/2433*  (2013.01)
*G11B 7/243*   (2013.01)

(52) U.S. Cl.
CPC ............. *G11B 9/04* (2013.01); *G11B 11/08* (2013.01); *G11C 13/004* (2013.01); *G11C 13/0007* (2013.01); *G11C 13/0097* (2013.01); *G11C 13/047* (2013.01); *G11B 2007/2432* (2013.01); *G11B 2007/24306* (2013.01); *G11B 2007/24324* (2013.01)

(58) Field of Classification Search
CPC ......... G11B 7/2433; G11B 9/04; G11B 11/08; G11B 7/00454; G11B 2007/24306; G11B 2007/24324; G11B 2007/2432
USPC ..................... 365/36, 100, 148, 163, 175
See application file for complete search history.

(56) References Cited

U.S. PATENT DOCUMENTS

2006/0105556 A1\* 5/2006 Matsui ............... C23C 14/0623
                                                    438/584
2009/0003034 A1\* 1/2009 Happ ..................... G11C 7/24
                                                    365/148

\* cited by examiner

ULTRAFAST QUENCH BASED NONVOLATILE BISTABLE DEVICE

The present invention describes an ultrafast quench based nonvolatile bistable memory device based on switching a material between an equilibrium state A to a persistent state B by means of an ultrafast quench. State B is characterized by a textured structure, which is metastable and cannot be formed by gradual thermal treatment of the material, is not amorphous, and is not reachable by means other than by exposure to a temporally short perturbation, caused typically, but not limited to, an ultrashort laser pulse. As an example, the switching from state A to state B of a small spot on the surface of a 1 T-$TaS_2$ crystal is achieved by the application of a ultrashort laser pulse, typically 50 fs in length, which enables the material to cool sufficiently rapidly (quench) through a phase transition to cause the formation of metastable textures. The materials properties of the thus created state B is sufficiently different from state A, to be detected by a change of optical reflectivity or transmissivity, or other means such as electrical resistance. Switching from state B to A can be achieved by the application of another longer laser pulse or by local heating.

BACKGROUND OF THE INVENTION

Current state of the art refers to materials which change phase under the influence of light or electric field or current for use as non-volatile memory elements. These phase-change memories (also known as PCME, PRAM, PCRAM, Ovonic Unified Memory, Chalcogenide RAM and C-RAM) is a type of non-volatile computer memory. PRAMs exploit the unique behavior of chalcogenide glass. Heat produced by the passage of an electric current switches this material between two states, crystalline and amorphous. Recent versions can achieve two additional distinct states, in effect doubling their storage capacity. PRAM is one of several new memory technologies competing in the non-volatile role with the almost universal flash memory.

Stanford R. Ovshinsky of Energy Conversion Devices first explored the properties of chalcogenide glasses as a potential memory technology in 1960. In 1969, Charles Sie published a dissertation, ["Memory Devices Using Bistable Resistivity in Amorphous As—Te—Ge Films" C. H. Sie, PhD dissertation, Iowa State University, Proquest/UMI publication #69-20670, January 1969] ["Chalcogenide Glass Bistable Resistivity Memory" C. H. Sie, A. V. Pohm, P. Uttecht, A. Kao and R. Agrawal, IEEE, MAG-6, 592, September 1970] that both described and demonstrated the feasibility of a phase change memory device by integrating a chalcogenide film with a diode array. A study in 1970 established that the phase change memory mechanism in chalcogenide glass involves electric-field-induced crystalline filament growth. ["Electric-Field Induced Filament Formation in As—Te—Ge Semiconductor" C. H. Sie, R. Uttecht, H. Stevenson, J. D. Griener and K. Raghavan, Journal of Non-Crystalline Solids, 2, 358-370, 1970] In the September 1970 issue of Electronics, Gordon Moore published an article on the technology. However, material quality and power consumption issues prevented commercialization of the technology.

The crystalline and amorphous states of chalcogenide glass have dramatically different electrical resistivity. The amorphous, high resistance state represents a binary 0, while the crystalline, low resistance state represents a 1. Chalcogenide is the same material used in re-writable optical media (such as CD-RW and DVD-RW). In those instances, the material's optical properties are manipulated, rather than its electrical resistivity, as chalcogenide's refractive index also changes with the state of the material.

Wuttig and Yamanda Nat Mat 6, 824 (2007), Sokolowski-Tinten PRL 81, 3679 (1998), Siegel APL 84, 2250 (2004), Forst App. Phys. Lett. 77, 1964 (2000) report changes of the coherent phonon spectrum associated with the transition. Rueda APL 98 251906 (2011) discuss the difference in vibrational frequencies in amorphous and crystalline phases. The mechanism for switching is discussed by Kolobo et al Nat. mat 3, 703 (2004) who calculated an umbrella flip transition of Ge atoms responsible for switching between the amorphous and crystalline state. The present state of phase change memories was reviewed by Burr et al. (Journal of Vacuum Science and Technology B, 28, pp. 223-262, (2010)), listing pertinent patents and other publications.

Although PRAM has not yet reached the commercialization stage for consumer electronic devices, nearly all prototype devices make use of a chalcogenide alloy of germanium, antimony and tellurium (GeSbTe) called GST. The stoichiometry or Ge:Sb:Te element ratio is 2:2:5. When GST is heated to a high temperature (over 600° C.), its chalcogenide crystallinity is lost. Once cooled, it is frozen into an amorphous glass-like state and its electrical resistance is high. By heating the chalcogenide to a temperature above its crystallization point, but below the melting point, it will transform into a crystalline state with a much lower resistance. The time to complete this phase transition is temperature-dependent. Cooler portions of the chalcogenide take longer to crystallize, and overheated portions may be remelted. A crystallization time scale on the order of 100 ns is commonly found. [H. Horii et al., 2003 Symposium on VLSI Technology, 177-178 (2003).] This is longer than conventional volatile memory devices like modern DRAM, which have a switching time on the order of two nanoseconds. However, a January 2006 Samsung Electronics patent application indicates PRAM may achieve switching times as fast as five nanoseconds.

A more recent advance pioneered by Intel and ST Microelectronics allows the material state to be more carefully controlled, allowing it to be transformed into one of four distinct states; the previous amorphous or crystalline states, along with two new partially crystalline ones. Each of these states has different electrical properties that can be measured during reads, allowing a single cell to represent two bits, doubling memory density. [A Memory Breakthrough, Kate Greene, Technology Review, 4 Feb. 2008].

de Jong et al. (Phys. Rev. Lett. 108 157601 (2012)) report on magnetic non-volatile memory switching by laser-excited rare-earth orthoferrite $(SmPr)FeO_3$ demonstrating that a single 60 fs circularly polarized laser pulse is capable of creating a magnetic domain structure on a picosecond time scale with a magnetization direction determined by the helicity of light. Kirilyuk, Kimel and Rhasing (Rev. Mod. Phys. 82, (2010)) review the ultrafast switching of domain structures by laser pulses in different magnetic systems. The important role played by the magnetic domain wall dynamics in the process of the laser-induced magnetization reversal has recently been demonstrated using time-resolved magneto-optical imaging of laser-excited TbFeCo thin films Ogasawara et al., 2009.

None of the published works on magnetic systems discuss electronic or structural domain formation, or a quench mechanism for the formation of magnetic or any other kinds of domains.

Rini et al (Optics letters 30, 558 (2005)) describe an ultrafast switching device based on $VO_2$ which relies on switching of a first order structural transition, but does not involve domain formation by ultrafast quench, and the same transition can be achieved by slow thermal cycling.

Memristor memory recently developed by Hewlett Packard in 2008 [HP and Hynix to produce the memristor goods by 2013, PCs and Chips, 10 Oct. 2011] is based on the nonlinear resistance properties of metal-oxide-metal junctions, such that when current flows in one direction through a memristor, the electrical resistance increases; and when current flows in the opposite direction, the resistance decreases ("Mem ristor FAQ". Hewlett-Packard. http://www.hpl.hp.com/news/2008/apr-jun/memristor_faq. html Retrieved 2010 Sep. 3.).

Kahn (Appl. Phys. Lett., vol. 22, p. 111 (1973), U.S. Pat. No. 4,405,993, Sep. 20, 1983) reported on a memory device in which cooling of a (preferably) smectic liquid crystal display is used to create a strongly scattering and depolarizing smectic texture, whereby rapid cooling freezes in disorder present in the isotropic state, while slow cooling permits the disordered molecules to reorganize into the uniform nonscattering structure favored by the boundary conditions and be used to erase written information. The spot size of the scattering region is comparable to the dimensions of the laser beam, and according to the patent, the structure is stable in a temperature range between −10 and +40 C, which may be extended by special mixtures.

Yusupov et al (Nat. Phys. 6, 681 (2010)) discuss the formation of domains in $TbTe_3$ and related compounds $DyTe_3$, $K_{0.3}MoO_3$ and $TaSe_2$, created by an ultrafast quench mechanism and their annihilation on the picosecond timescale. The authors report on the creation of a domain structure with domains parallel to the surface of the crystal due to the inhomogeneous nature of the excitation and because of the fact that the coherence length of the order parameter in the material is much smaller than the photoexcited region, topological defects are created. They do not report on any metastable or persistent states in these compounds caused by the quench.

The technical problem which has not been solved according to the background prior art described above is solved by the current invention of an ultrafast quench based nonvolatile bistable device. Here the term "quench" is understood as defined by the Oxford English dictionary, namely as "rapidly cool".

SUMMARY OF THE INVENTION

The present invention describes the use of an electronic material which changes optical and electrical properties after a rapid quench through a phase transition caused by an ultrashort perturbance creating a textured state arising as a result of the rapid quench.

A laser pulse rapidly heats part of the elementary excitations of the material (electrons, particular phonons or spins) above a particular transition temperature $T_c$, which thereafter rapidly cool through $T_c$ towards equilibrium (a quench). During the quench process, topological defects or similar textures are spontaneously created. The physical origin of the effect is similar to the Kibble-Zurek mechanism described by Kibble (J. Phys: A-Math Gen 9, 1387-1398, 1976)) and Zurek (Nature, 317, 505 (1985)), whereby different regions of the photoexcited spot which undergo a phase transition—which may or may not involve symmetry breaking—recover with different amplitude, phase and direction of the order parameter in different regions. Since the different regions in space are causally unconnected, multiple domains form, which may be stable under certain conditions, and may even form a periodic structure. Such an effect occurs when the coherence length of the system is smaller than the size of the excited volume undergoing the transition. In another embodiment, the quench process causes a phase separation, or a mesoscopically mixed phase when the transition is of first order. In all cases the new state is persistent at ambient temperature, the lifetime being sufficiently long to allow long term storage. A transition from a metastable state back to the thermodynamic ground state can be achieved by heating with a laser or heating by other means.

The practical value emerges from the property of a material such as 1 $T-TaS_2$ to semi-permanently change its state to a topologically textured one on a mesoscopic scale with concurrent change of its optical and/or electrical properties after illumination of its surface by a very short laser pulse, typically shorter than 5 picoseconds. Unlike in phase change devices, where the change of phase refers to a change between crystalline and amorphous phases, or between two thermodynamically distinct homogeneous phases, the change of state here refers to a change of state where electronic, magnetic and structural ordering are modified during the rapid quench to form a mesoscopically textured state. The change of state from the thermodynamic ground state occurs only under strongly non-equilibrium conditions, referring to thermal equilibrium, more specifically to the non-equilibrium of the electronic, magnetic or lattice excitations.

The materials used may be, but not limited to, any of the layered transition metal or rare-earth chalcogenides and their polytypes, such as, but not limited to 1 $T-TaS_2$, $4Hb-TaS_2$, $TbTe_3$, a molybdenum oxide $Mo_xO_y$, or other transition metal dichalcogenides, trichalcogenides and oxides including, but not limited to, the metals tungsten, titanium, niobium, terbium, samarium, gadolinium, dysprosium and molybdenum, which exhibit charge/spin density wave ordering in their ground state and phase transitions in the temperature range between the liquid helium temperature and their respective melting, sublimation or decomposition temperature. The material may be in the form of a single crystal, or a thin film deposited on a substrate or a disk, such as a $MX_2$ monolayer, or grown by other means, such as, but not limited to, molecular beam epitaxy, chemical vapor deposition, atomic layer deposition and pulsed laser deposition.

Figure 2:
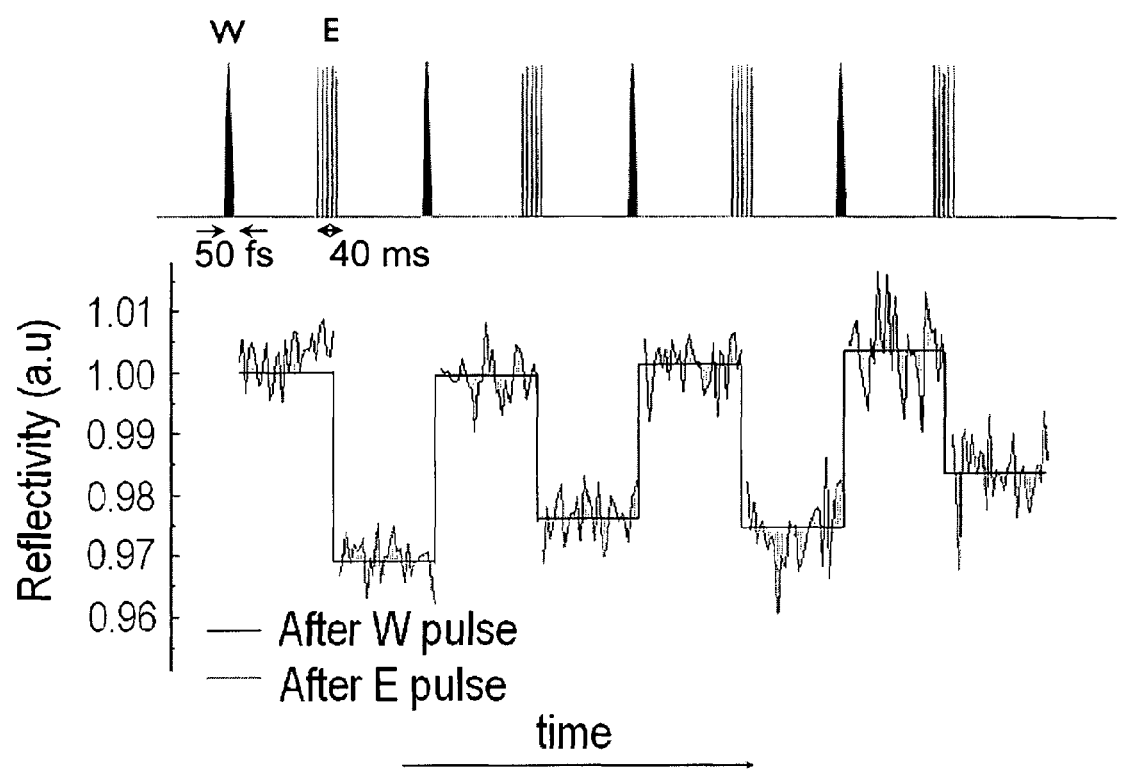
Figure 3:
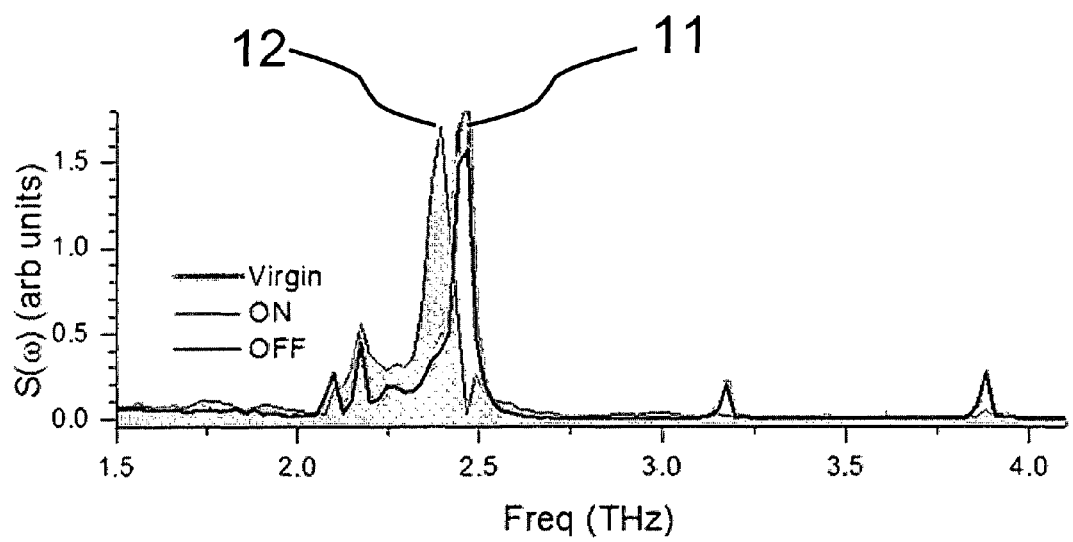
Figure 4:
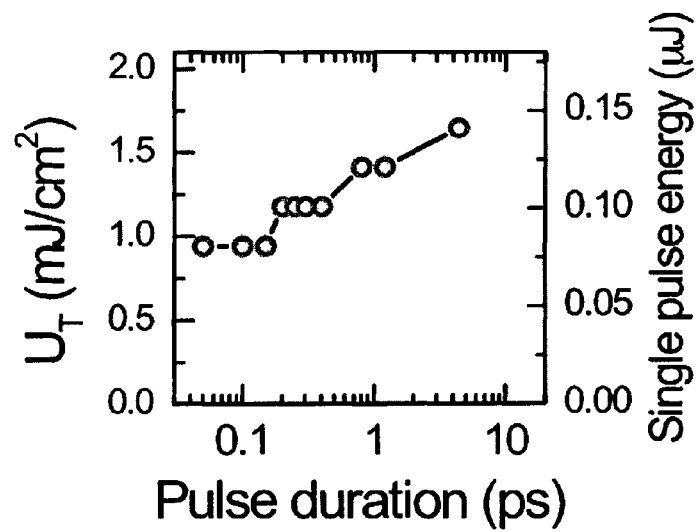
Figure 5:
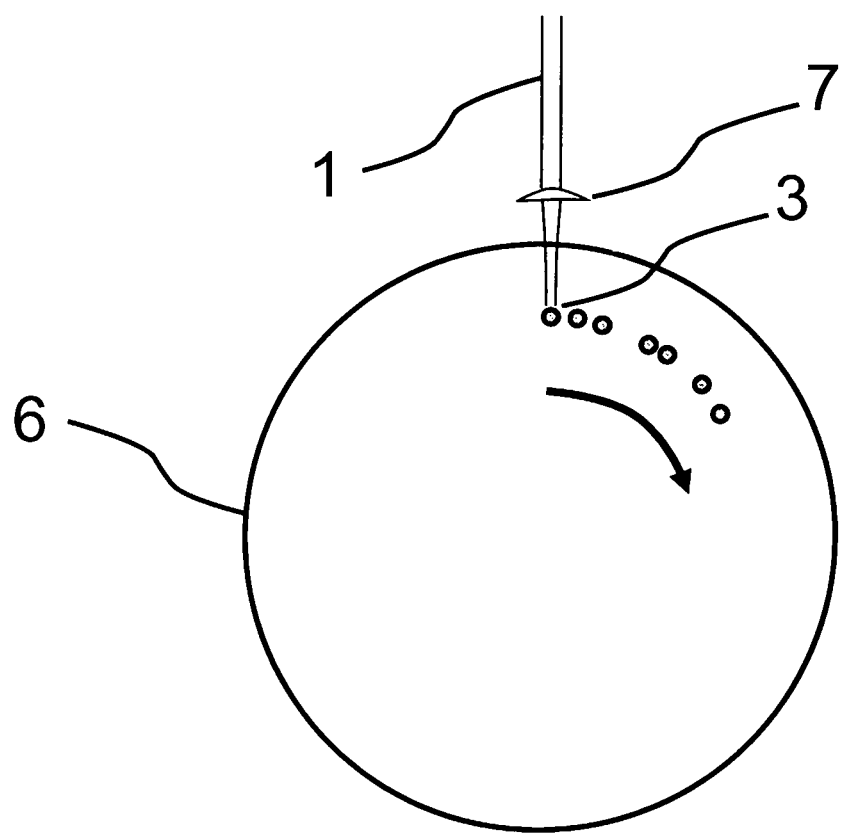
Figure 6:
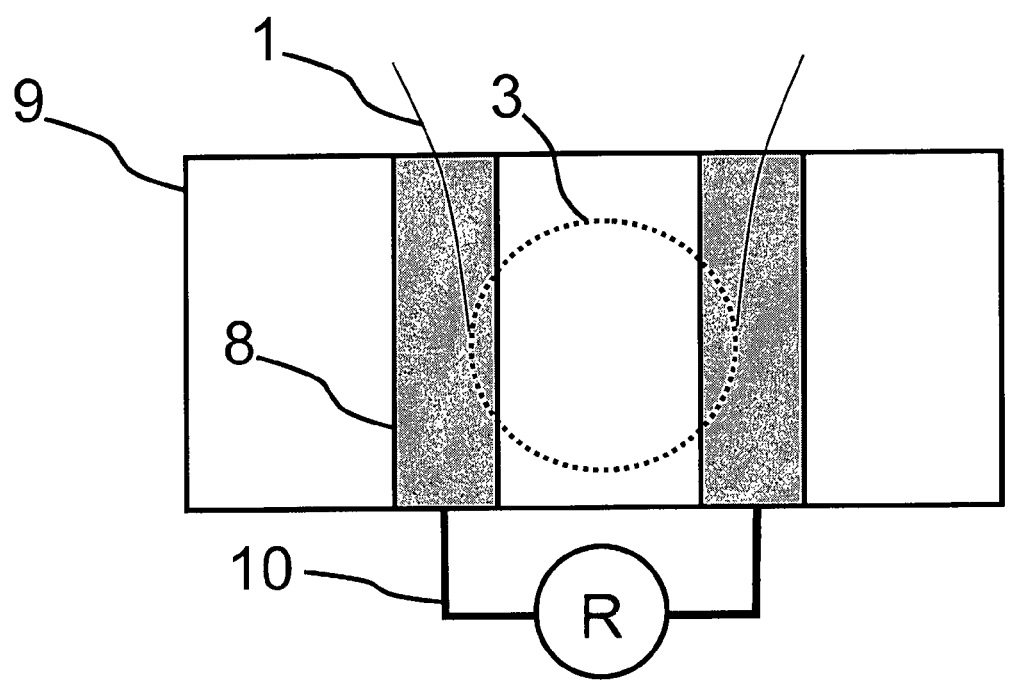
Figure 7:
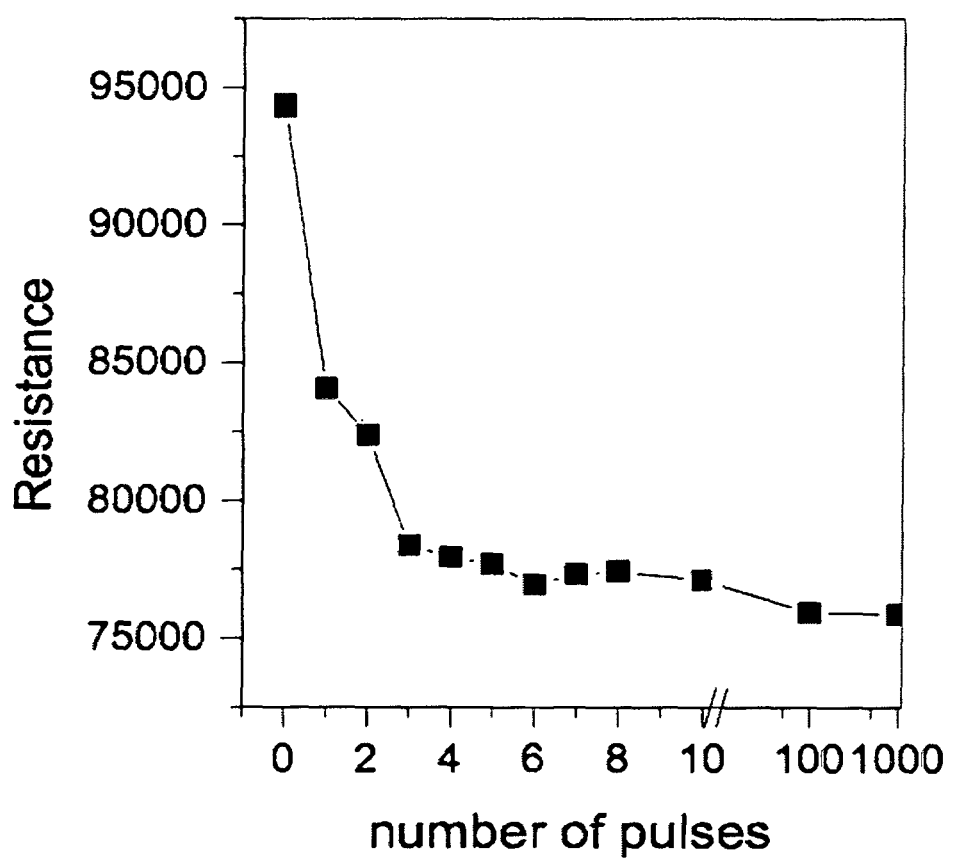

The invention is described with the reference to the accompanying figures:

FIG. 1 represents a schematic diagram of the laser writing process on a crystal such as 1 $T-TaS_2$, FIG. 2 represents the pulse sequence used to repetitively write (W) and erase (E) information onto a $1T-TaS_2$ crystal at a temperature of 30 K, FIG. 3 represents the spectrum of the collective amplitude mode (AM) at 2.46 THz and phonon modes (2.1, 2.17, 3.18 and 3.88 THz) in the Virgin state and after a switching cycle, FIG. 4 represents the threshold energy UT of the W pulse as a function of pulse length between 50 fs and 4 ps, FIG. 5 represents a schematic representation of a spinning disk coated with an appropriate material such as 1 $T-TaS_2$, FIG. 6 represents two contact circuit showing the geometry of laser pulse-induced resistance switch, FIG. 7 represents resistance of the circuit in FIG. 6 after exposure to 50 fs laser pulses, each with an energy density of 6 $mJ/cm^2$.

In the main embodiment of the present invention, writing data into the material is performed by an ultrashort laser pulse—typically of a length 50 fs at a wavelength of 780 or 800 nm focused down to an arbitrary spot dimension, limited by diffraction. After exposure to one or more pulses a spot is created on the material which has a modified amplitude, phase and topological structure of the order parameter compared to the pristine state and modified microscopic properties as shown in FIG. 1. A focused laser beam 1 with a single ultrashort laser pulse is focused onto a small spot on the surface 2. The pulse causes a change of state within part of the absorbed volume, such that the spot 3 is characterized by a modified reflectivity. The lateral inhomogeneity of the laser beam 1 causes an inhomogeneous change to the sample, in a concentric fashion 4. A schematic representation of the texture of the order 5 within the switched spot 3 after exposure to a spatially inhomogeneous ultrashort laser pulse is shown in FIG. 1c and FIG. 1d. At the laser wavelength of 800 nm, which is typically used, the absorption depth is approximately 20 nm. The laser inhomogeneity is much greater perpendicular to the surface than parallel to the surface, so the textures have a much smaller characteristic dimension perpendicular to the surface than parallel.

The critical parameters for performing the change of state are the energy density per unit volume and the pulse length of the external perturbation, which depends on the incident laser pulse parameters and the penetration depth of the light. When laser pulsed excitation is used, the laser energy density needs to exceed a critical value to cause a state change, while the pulse length needs to be sufficiently short to cause a change to the equilibrium state.

In another embodiment, ultrashort electrical pulses are used to achieve switching, for example with pulses generated by electro-optic sampling circuit, utilizing the Pockels effect for the generation of ultrashort electrical pulses from ultrashort laser pulses.

Readout can be performed by measurement of optical reflectivity, where the magnitude of the reflectivity change depends on the wavelength of light, or electrical resistivity between two or more contacts by any preferred method.

Erasure is performed by heating either the spot with a longer laser pulse, or by a local electrical heater embedded in the device or by heating the entire sample to a critical temperature above the ambient temperature at which the state change takes place.

In one preferred embodiment of the invention, an ultrashort laser pulse causes a persistent change of the resistance of a thin film, whose thickness is comparable to the optical penetration depth of the light used to switch the state. The resistance can be measured between two contacts by means of an appropriate electrical circuit. An array of gaps can be used to construct a multi-element device, employing a similar strategy as in phase change devices.

The state after the quench can be optically or electronically inhomogeneously textured, or can form an ordered textured state, which has different materials properties from the pristine state.

Specific advantages of a memory device:
1. Write operation per bit can be achieved with perturbations lasting 50 fs or less, which is significantly faster than other competing memory devices.
2. Read speed externally is limited by optical processing, or by external circuit characteristics.
3. The memory element is non-volatile.
4. Erase speed in individual elements is determined by the thermal properties of the material in a thin film and can be as fast as picoseconds.
5. Bulk erase can be achieved by heating above a specific temperature.

The invention of an ultrafast quench based nonvolatile bistable device consists of an active material on a passive or active substrate which changes its materials properties, after exposure to a sufficiently temporally short external perturbation causing an ultrafast quench. The perturbation can be from an external ultrashort laser pulse or ultrafast electrical pulse from an electrooptic device or any other generator of ultrashort pulses. This change of the materials properties can be detected as a change of optical properties or electrical resistance. The dielectric properties can be reverted back to their original state by the application of a heat pulse applied by an electrical heater within the device or an external laser. The device can be integrated either as an array within an electronic chip using silicon-based technology, or on any other substrate which can be addressed optically or electrically. Alternatively it may be used a data storage device in the form of a spinning disk coated with the active material, onto which ultrashort laser pulses are used to write data, which are read by detecting the reflected or transmitted light.

EXAMPLES

The following examples illustrate the invention without limiting it thereto.

Example 1

A crystal of 1 T-TaS$_2$ at an ambient temperature of 30 K is (state A) is illuminated by a single 50 fs laser write (W) pulse with an energy of 1 mJ/cm$^2$ with a wavelength of 800 nm focused into a 50 micron diameter spot (FIG. 1a-c). After exposure to the W pulse the new state is characterized by a modified optical reflectivity which changes by approximately 5% as measured by a continuous reflected laser beam at 800 nm (FIG. 2). The change of state is also accompanied by a change of the collective mode frequency as shown in FIG. 3 measured by the coherent pump-probe optical spectroscopy. The collective amplitude mode 11 frequency in the virgin state is 2.46 THz. After the W pulse a new mode 12 appears with a frequency 2.39 THz, of approximately the same width as the original mode, which disappears after the W pulse. In addition, the amplitudes of other modes at 2.1, 2.17, 3.18 and 3.88 THz change reversibly in the switched state indicating the presence of an ordered state. The frequency of the collective mode at 2.39 THz does not correspond to any known equilibrium phase of the material or polytype structure at this temperature and signifies a new state of matter created by the ultrafast quench. The switching can be achieved only by ultrashort laser pulses, shorter than 5 ps, where the switching threshold $U_T$ increases with increasing pulse length beyond 50 fs. FIG. 4 shows the threshold at 30 K in one particular example. Pulses longer than 5 ps did not give rise to switching.

The system can be switched back from state B to state A by the application of a 40 ms pulse train of 10$^4$ pulses, each 50 ps long, denoted as the Erase pulses (E) (FIG. 2). Both the reflectivity and the collective mode frequency revert back to original values after exposure to the E pulses. The process is repeatable and very robust, and is not dependent on the origin or detailed growth conditions of the 1 T-TaS$_2$ crystal.

Example 2

A pulse train from a mode locked semiconductor laser operating at 780 nm with 1 picosecond pulse duration and high repetition rate with peak energy of 1 mJ/cm$^2$ is modulated by an optical data modulator to provide a laser pulse sequence which carries information in a binary code. The beam 1 (see FIG. 5) is focused via a lens 7 onto a rotating disc 6 coated with crystalline or polycrystalline 1 T-TaS$_2$ deposited onto a supportive substrate material. The rotation speed of the disk is such that each laser pulse from the pulse train is impinging onto a fresh spot. Each laser pulse causes a change of state within the focused spot 3 which acts as a storage bit. The surface of the disk thus contains bitwise data storage which can be read by optical means which detects the spatial modulation of the reflectivity of the surface (FIG. 5).

Example 3

A thin film of 1 T-TaS$_2$ is deposited on a sapphire substrate 9 (see FIG. 6) by the sticky-tape method, whereby first a single crystal is pressed on the sapphire, and then subsequently exfoliated by sticky tape until an appropriately thin film of 1 T-TaS$_2$ remains on the sapphire. Contacts 8 are placed on the top surface of the thin film by standard lithographic techniques. The distance between contacts is 20 micrometers. The resistance between the contacts 10 is measured at an ambient temperature of 30 K with an ohm-meter. Individual 50 fs laser pulses are selected from a train of pulses with an acousto-optic modulator and focused 1 in between the contacts into a spot 3, 20 micrometers in diameter. Upon exposure to 50 fs pulses at 800 nm, with an energy density of 6 mJ/cm$^2$ the resistance is changed as shown in FIG. 7. In this example, after the first 50 fs pulse, the resistance drops from 94 kOhms to 84 kOhms. After the second pulse, the resistance drops to 82.5 kOhms, and after the third pulse it drops to 78 kOhms, eventually saturating at around 75 kOhms. Only a very small further resistance change is observed after 4 pulses. The resistance change signifies a bit change. The resistance is reset by heating above 100 K. This can be achieved by heating the entire sample, or via Joule heating of the area between the contacts by a separate heating circuit.

The invention claimed is:

1. An ultrafast quench based nonvolatile bistable device which shows a change of reflectivity, transmittance or electrical resistance of a solid state material as a result of the transition from state A to state B, where state A is in a stable thermodynamic state of the material and state B, where state B is a mesoscopically textured state, wherein State B is a stable thermodynamic state of the material formable solely through an temporally short external perturbation resulting in a rapid quench through a phase transition, wherein the temporally short external perturbation is caused by an ultrashort laser pulse or an ultrafast electrical disturbance, and wherein the material used is a polytype of TaS2 or transition metal dichalcogenides, trichalcogenides.

2. An ultrafast quench based nonvolatile bistable device according to claim 1, wherein the temporally short external perturbation is shorter than 5 picoseconds.

3. An ultrafast quench based nonvolatile bistable device according to claim 1 wherein state B is characterized by a specific domain structure or texture with a modified dielectric function with respect to state A.

4. An ultrafast quench based nonvolatile bistable device according to claim 1 wherein both states are stable for long periods at ambient temperature.

5. An ultrafast quench based nonvolatile bistable device according to claim 1 made in the form of thin film on a disk which can be quenched locally by a focused laser spot and read by monitoring the reflectivity with a polarised or unpolarised laser beam.

6. An ultrafast quench based nonvolatile bistable device according to claim 1 wherein a single crystal, thin crystalline or polycrystalline film of said material is used.

7. An ultrafast quench based nonvolatile bistable device according to claim 1 wherein the active material is deposited on a substrate by a means comprising one of the group selected from molecular beam epitaxy, chemical vapor deposition, atomic layer deposition and pulsed laser deposition.

8. An ultrafast quench based nonvolatile bistable device according to claim 1, stabilized by extrinsic defects or nanoscale patterning.

9. An ultrafast quench based nonvolatile bistable device according to claim 1 wherein the laser quench causes the formation of a domain structure or texture with different dielectric function than the original state, in a material exhibiting a symmetry breaking transition.

10. An ultrafast quench based nonvolatile bistable device according to claim 1 wherein the temporally short external perturbation is caused by an ultrashort electromagnetic field pulse.

11. An ultrafast quench based nonvolatile bistable device according to claim 1 which changes resistance after exposure to a single ultrashort laser pulse.

12. An ultrafast quench based nonvolatile bistable device according to claim 11 which can return to State A from State B through heating above a specific temperature.

13. An ultrafast quench based nonvolatile bistable device according to claim 11 characterized by a state change from a stable charge/spin density wave state to a different persistent charge/spin density wave state.

14. An ultrafast quench based nonvolatile bistable device which shows a change of reflectivity, transmittance or electrical resistance of a solid state material as a result of the transition from state A to state B, where state A is in a stable thermodynamic state of the material and state B, where state B is a mesoscopically textured state, wherein State B is formable solely through an temporally short external perturbation resulting in a rapid quench through a phase transition, wherein the material used is a pure metal containing small amounts of impurity such as C, or other elements to stabilize state B.

* * * * *